(12) United States Patent
Tanitsu

(10) Patent No.: US 6,236,449 B1
(45) Date of Patent: May 22, 2001

(54) ILLUMINATION OPTICAL APPARATUS AND EXPOSURE APPARATUS

(75) Inventor: Osamu Tanitsu, Funabashi (JP)

(73) Assignee: Nikon Corporation, Toyko (JP)

( * ) Notice: Subject to any disclaimer, the term of this patent is extended or adjusted under 35 U.S.C. 154(b) by 0 days.

(21) Appl. No.: 09/271,081

(22) Filed: Mar. 17, 1999

(30) Foreign Application Priority Data

Mar. 19, 1998 (JP) .................................. 10-090959

(51) Int. Cl.$^7$ ............................. G03B 27/72; G03B 27/42

(52) U.S. Cl. ............................. 355/67; 355/53; 362/268; 362/551; 362/553

(58) Field of Search .................................. 355/56, 67, 71; 362/268, 551, 553; 359/894, 503; 385/146, 147

(56) References Cited

U.S. PATENT DOCUMENTS

| | | | |
|---|---|---|---|
| 4,744,615 | 5/1988 | Fan et al. .............................. | 350/96.1 |
| 4,918,583 | 4/1990 | Kudo et al. ............................ | 362/268 |
| 5,059,013 | * 10/1991 | Jain ...................................... | 359/894 |
| 5,357,312 | * 10/1994 | Tounai .................................. | 355/67 |
| 5,675,401 | * 10/1997 | Wangler et al. ....................... | 355/67 |
| 5,757,470 | * 5/1998 | Dewa et al. ........................... | 355/67 |
| 6,067,146 | * 5/2000 | Mulkens et al. ...................... | 355/71 |

\* cited by examiner

*Primary Examiner*—Alan A. Mathews
(74) *Attorney, Agent, or Firm*—Oliff & Berridge PLC

(57) ABSTRACT

An exposure apparatus for patterning a photosensitive substrate with a pattern formed on a mask includes an illumination optical system for illuminating the mask, and a projection optical system arranged in an optical path between the mask and the photosensitive substrate, so as to project an image of the pattern formed on the mask onto the photosensitive substrate. The illumination optical system includes a light source, a light guide optical system, an internal reflection-type integrator and an imaging optical system. The light source provides a light beam having a cross-sectional shape. The light guide optical system is disposed in the optical path between the light source and the mask, so as to guide the light beam to a convergence point. The internal reflection-type integrator is disposed in the optical path between the light guide optical system and the mask so as to form a plurality of secondary light sources. The internal reflection-type integrator has a rectangular cross-sectional shape with a first side of length dx along a first direction perpendicular to an optical axis and a second side dy along a second direction perpendicular to the first direction and the optical axis, and has an incident surface spaced from the convergence point along the optical axis by spacing L. The imaging optical system is disposed in the optical path between the internal reflection-type integrator and the mask so as to direct the light beam to the mask. Additionally, the following conditions are satisfied:

$$0.1 \leq L \leq dx/(2 \times \tan \alpha x)$$

$$0.1 \leq L \leq dy/(2 \times \tan \alpha y),$$

wherein $\alpha x$ is an angle of the light beam incident to the incident surface, as measured in a first plane parallel to the first direction that includes the optical axis, and $\alpha y$ is an angle of the light beam incident to the incident surface, as measured in a second plane orthogonal to the first plane that includes the optical axis.

33 Claims, 4 Drawing Sheets

ILLUMINATION OPTICAL APPARATUS AND EXPOSURE APPARATUS

FIELD OF THE INVENTION

The present invention relates to an illumination optical apparatus and an exposure apparatus provided with the illumination optical apparatus, and more particularly relates to illumination optical apparatus employing light pipe optical integrators.

BACKGROUND OF THE INVENTION

Japanese Patent Application Kokai No. Hei 8-6175 discloses an illumination optical apparatus suited to exposure apparatus for manufacturing semiconductor devices. This illumination optical apparatus uses an internal reflection, elongate (i.e., rod-type) optical integrator to form a plurality of light source images from a primary light beam from a light source. Such integrators are referred to in the art as "light pipes" and so this term is used hereinafter.

The above-mentioned prior art illumination optical apparatus includes a condenser lens which condenses the primary light beam onto the incident surface of the integrator. This beam is then split by internal reflection within the light pipe into a plurality of secondary light beams. These secondary light beams proceed in predetermined angular directions based on the geometry of the integrator. A plurality of light source images (i.e., virtual light sources) associated with the plurality of secondary light beams are formed along the plane of the incident surface of the integrator. The plurality of secondary light beams, each appearing to emanate from a corresponding light source image, pass through a condenser lens and illuminate a surface to be irradiated, such as a mask.

The increasing degree of integration of semiconductor devices has lead to the commercialization and development of excimer lasers and other intense light sources for use in exposure apparatus for manufacturing semiconductor devices. Excimer lasers, for example, operate at an oscillation wavelength of 248 nm or 193 nm and have a high power output. Accordingly, conventional illumination optical apparatus, such as discussed immediately above, are not generally amenable for use in an exposure apparatus employing such a high-output light source. This is because a light pipe formed of glass material is prone to breaking due to the concentration of light energy at a convergence point formed on the incident surface of the integrator.

SUMMARY OF THE INVENTION

The present invention relates to an illumination optical apparatus and an exposure apparatus provided with the illumination optical apparatus, and more particularly relates to illumination optical apparatus employing light pipe optical integrators.

The present invention takes the abovementioned problems into consideration, and has the goal of providing an illumination optical apparatus wherein the integrator is not prone to breaking when used with a high-output light source like an excimer laser. A further goal is to provide an exposure apparatus provided with the aforesaid illumination optical apparatus.

Accordingly, a first aspect of the present invention is an illumination optical apparatus for illuminating an illumination surface. The apparatus comprises, in order along an optical axis, a light source capable of providing a primary light beam having a cross-section, and a condenser optical system to condense the primary light beam so as to form a convergence point adjacent the condenser optical system. Adjacent the condenser optical system is a light-pipe optical integrator having a rectangular cross-sectional shape with a first side of length dx, a second side of length dy, and a most light-source-wise incident surface axially spaced from the convergence point by a spacing L. The integrator is capable of forming a plurality of secondary light sources and corresponding secondary light beams from the primary light beam. Adjacent the light pipe optical integrator is an imaging optical system to converge the primary and secondary light beams to illuminate the illumination surface. The following conditions are also preferably satisfied:

$$0.1 \leq L \leq dx/(2 \times \tan \alpha x)$$

$$0.1 \leq L \leq dy/(2 \times \tan \alpha y),$$

wherein $\alpha x$ is an angle of the primary light beam incident the incident surface, as measured in a first plane that includes the optical axis, and $\alpha y$ is an angle of the primary light beam incident the incident surface, as measured in a second plane orthogonal to the first plane.

A second aspect of the present invention is the optical apparatus as described above, further including first and second variable optical members capable of shaping the primary light beam cross-section so as to make this cross-section and the integrator cross-section have a substantially similar size and shape.

A third aspect of the present invention is an exposure apparatus for exposing a pattern present on a mask onto a photosensitive substrate. The exposure apparatus comprises, in order along an optical axis, the illumination optical system as described above, and a projection optical system arranged adjacent the illumination surface so as to project an image of the mask arranged at the illumination surface to expose the mask pattern onto the photosensitive substrate.

A fourth aspect of the invention is a method of uniformly illuminating a surface with an illumination optical apparatus having a light pipe optical integrator with a cross-section, an incident surface and an exit surface. The method comprises the steps of first providing a primary light beam having a primary light beam cross-section, then condensing the primary light beam and forming a convergence point at a position spaced apart from the incident surface, then collecting light emanating from the convergence point at an angle $\alpha$ using the light pipe optical integrator, then forming a plurality of secondary light sources and associated secondary light beams by multiply internally reflecting the light within the light pipe optical integrator, and then finally converging the primary and secondary light beams emanating from the exit surface so as to uniformly illuminate the illumination surface.

DETAILED DESCRIPTION OF THE INVENTION

The present invention relates to an illumination optical apparatus and an exposure apparatus provided with the illumination optical apparatus, and more particularly relates to illumination optical apparatus employing light pipe integrators.

Figures 1A, 1B:
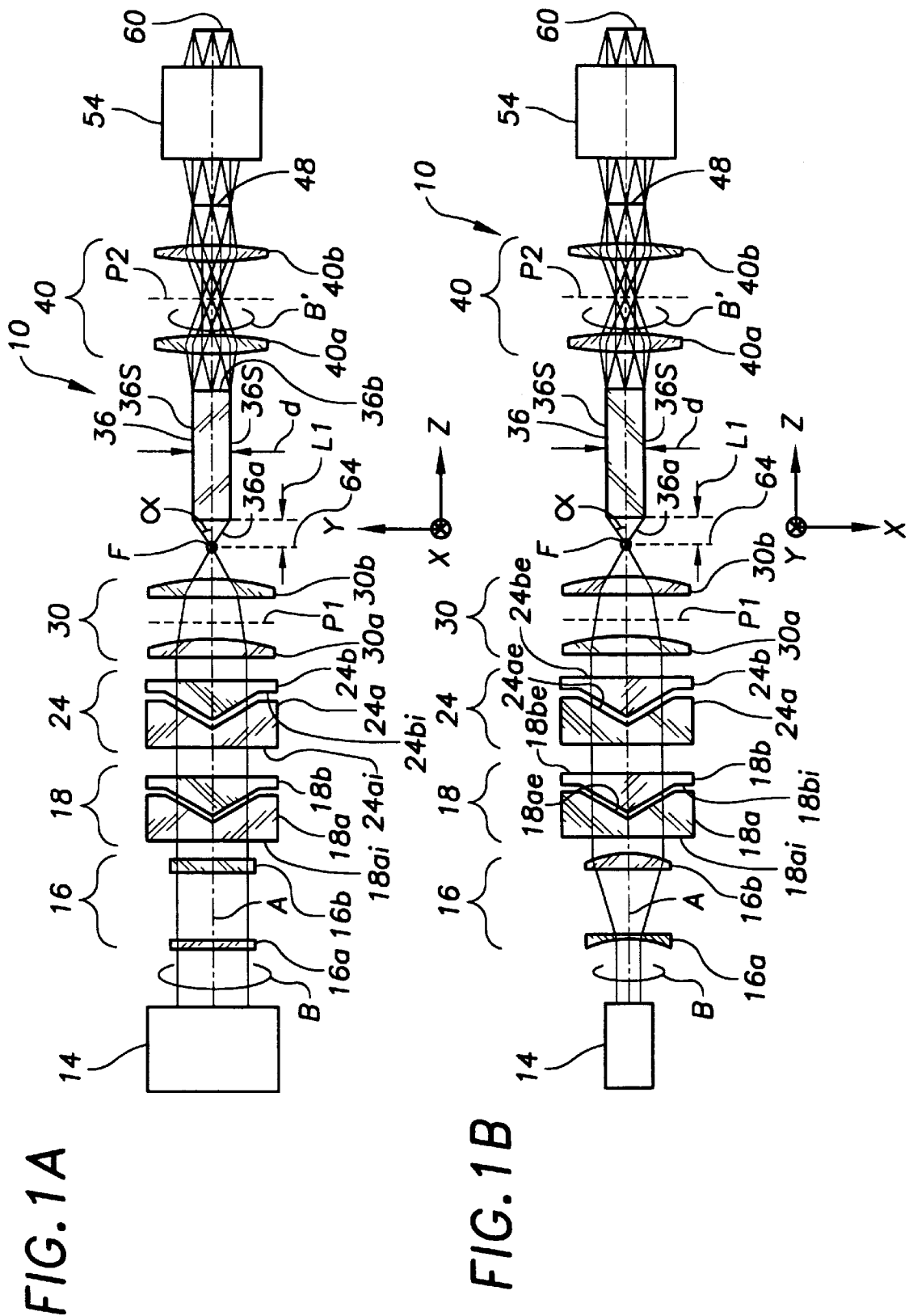
FIG. 1A is a schematic optical diagram in the Y-Z plane of a first embodiment of the exposure apparatus of the present invention provided with a first embodiment of the illumination optical apparatus of the present invention.
FIG. 1B is a schematic optical diagram in the X-Z plane of the exposure apparatus of FIG. 1A.
Figure 2:
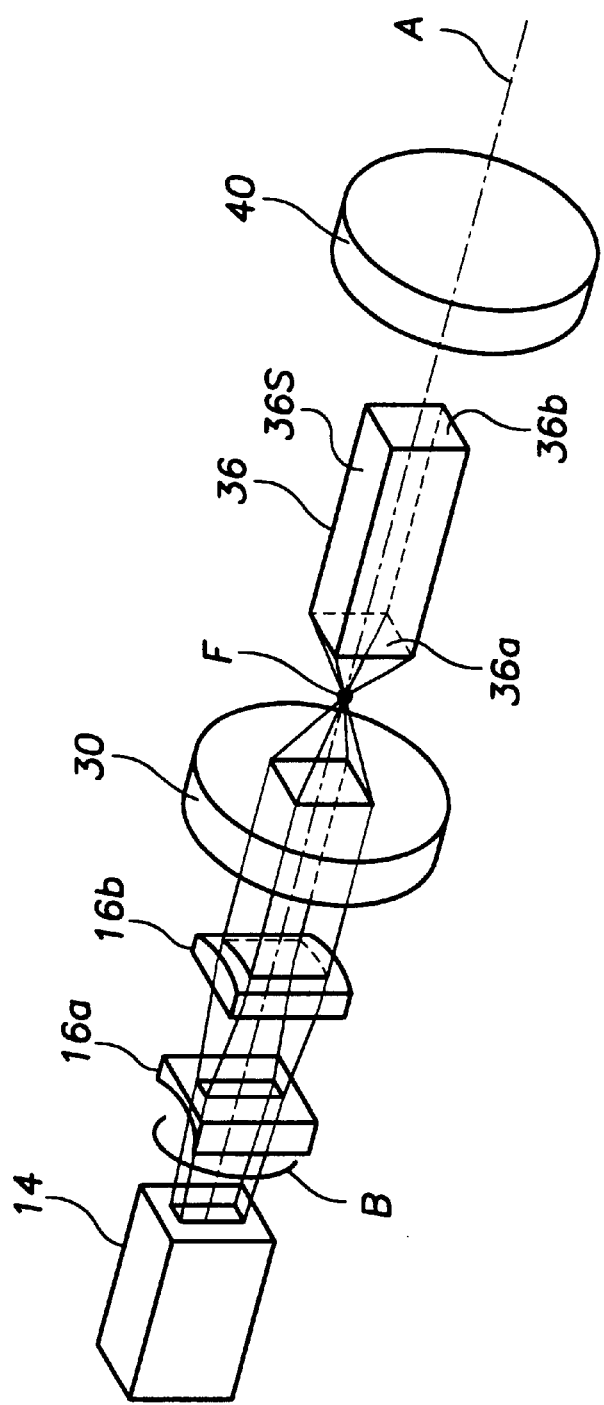
FIG. 2 is a schematic optical diagram, perspective view, of the exposure apparatus of FIG. 1A.

With reference now to FIGS. 1A, 1B and FIG. 2, exposure apparatus 10 comprises, in order along an optical axis A, a light source 14 capable of providing a primary light beam B having a given cross-sectional shape such as, for example, rectangular. Light source 14 may be, for example, an excimer laser providing laser light having a wavelength of 248 nm or 193 nm. A cylindrical expander 16 is disposed at a predetermined position to receive light beam B from the light source. Cylindrical expander 16 comprises a pair of cylindrical lenses 16a and 16b having negative refractive power and positive refractive power, respectively, in the X-Z plane (FIG. 1B). Lenses 16a and 16b function as a plane parallel plate in the Y-Z plane (FIG. 1A). It is preferred that cylindrical lenses 16a and 16b constitute a focal zoom lens so that the rectangular ratio of the cross-section of light beam B can be properly modified.

A light beam shape changing system is disposed at a predetermined position to receive light beam B from cylindrical expander 16. The light beam shape changing system forms an annular light beam or a plurality light beams eccentric to optical axis A based on light beam B from the cylindrical expander 16. The light beam shape changing system comprises first variable optical member 18 comprising a pair of conical prisms 18a and 18b, and a second variable optical member 24 comprising a pair of pyramidal prisms 24a and 24b. The construction of first and second variable optical members 18 and 24 are discussed in greater detail below. A condenser optical system 30 is disposed at a predetermined position to receive light beam B from the light beam shape changing system (18, 24). The condenser optical system 30 has a pupil plane P1 and a variable focal length, and a light pipe optical integrator (i.e., a rod-type integrator or a internal reflection-type glass rod) 36 disposed at a predetermined position to receive light beam B from condenser optical system 30. The light pipe optical integrator includes an incident surface 36a, an exit surface 36b, and an outer surface 36S. Integrator 36 has, in the first embodiment, a substantially square cross-section. Integrator 36 also preferably is made of a glass material, such as quartz glass or fluorite.

Adjacent integrator 36 is an imaging optical system 40 with a pupil plane P2 and two lens elements 40a and 40b, a mask 48 with pattern (not shown) thereon, a projection optical system 54 and a wafer 60 serving as a photosensitive substrate. In exposure apparatus 10, integrator exit surface 36b and mask 48 are optically conjugate, and mask 48 and wafer 60 are optically conjugate. Elements 14–40 of exposure apparatus 10 constitute a first embodiment of the illumination optical apparatus of the present invention.

With continuing reference to FIGS. 1A and 1B, the operation of exposure apparatus 10 is now described. Light source 14 emits light beam B having a rectangular cross-section that extends lengthwise along the Y-direction. Light beam B enters cylindrical expander 16, which expands the light beam in the X-Z plane (FIG. 1B and FIG. 2), so that the light beam has a substantially square cross-section. Light beam B exits from cylindrical expander 16, passes through conical prisms 18a and 18b, and pyramidal prisms 24a and 24b, and enters condenser optical system 30. The action of conical prisms 18a and 18b and pyramidal prisms 24a and 24b constituting first and second variable optical members 18 and 24, respectively, is explained in greater detail below. It is assumed in the explanation below that light beam B exiting cylindrical expander 16 maintains its cross-sectional shape upon passing through conical prisms 18a and 18b and pyramidal prisms 24a and 24b.

Light beam B passes through condenser optical system 30 and converges at a convergence point F on optical axis A, whereupon the beam then diverges from convergence point F at an angle α (measured with respect to optical axis A), and then enters integrator 36. Multiple light source images (not shown) are formed by light beam B entering integrator 36 through incident surface 36a and multiply internally reflecting from outer surfaces 36S of integrator 36. The number of light source images so formed corresponds to the number of internal reflections. The light source images are formed along a surface 64 that passes through convergence point F and that is parallel to incident surface 36a of integrator 36. Accordingly, the light source images are nearly all virtual images, with only the center (i.e., convergence point F) light source image being a real image.

Thus, the light source images (or, the multiple reflections) form a plurality of secondary light beams B' which superimpose at exit surface 36b of integrator 36. Light beams B' then pass through imaging optical system 40, which directs the light beams to uniformly illuminate mask 48. Accordingly, a substantially square illumination field (not shown) is formed on mask 48. This illumination field is similar to the cross-sectional shape of integrator 36. Light beams B' passing through mask 48 then pass through projection optical system 54, which forms an image of the mask pattern on wafer 60. In this manner, the pattern of mask 48 is successively exposed on each exposure region (not shown) of wafer 60 by performing exposures while driving and controlling (i.e., "stepping") wafer 60 in the X-Y plane.

With continuing reference to FIGS. 1A and 1B, convergence point F is spaced apart from incident surface 36a of integrator 36 by a distance L1. In prior art apparatus, the convergence point is formed on the incident surface of the integrator. However, in the present invention, such a concentration of energy on incident surface 36a integrator 36 is avoided. As a result, solarization is satisfactorily controlled, and the formation of contaminants due to photochemical reactions is reduced. This prevents integrator 36 from being damaged or from breaking when used in conjunction with a high-output light source like an excimer laser.

To ensure the risk of damaging or breaking integrator 36 is minimized, and to avoid optical losses at incident surface 36a, it is preferred that spacing L1 satisfy the following condition:

$$0.1 \text{ mm} \leq L1 d/(2 \times \tan \alpha) \tag{1}$$

wherein d is the length (mm) of one side of the square cross-sectional surface of integrator 36.

If spacing L1 falls below the lower limit in condition (1), the spacing narrows excessively, increasing the concentration of energy on incident surface 36a. This, in turn, greatly increases the likelihood of integrator 36 being damaged or breaking. On the other hand, if spacing L1 exceeds the upper limit in condition (1), the spacing widens excessively. In this case, incident light beam B no longer entirely passes through incident surface 36a, resulting in a loss of light (and thus exposure, energy). The optimal spacing L1 is specified within the range of condition (1) in accordance with the magnitude of the output energy of the light source used and the cross-sectional shape of light beam B.

The following is a numerical example associated with a exposure apparatus 10, representing a Working Example of the first embodiment of the present invention. Let $L_{IN}$ be the axial length of integrator 36. If $L_{IN}$=1000 mm, the number of light source images formed (i.e., the number of light beams B' into which light beam B is split due internal reflections in integrator 36) is 1024 (i.e., 32×32). If length d of one side of the cross-section of integrator 36 is 10 mm, then $\alpha=\tan^{-1}[32\times(d/2)/L_{IN}]=9.1°$.

In this case, in view of condition (1), spacing L1 should be set within the range of 0.1 mm to 31.25 mm. To maintain a predetermined optical performance and to make exposure apparatus 10 compact, it is preferable to set length $L_{IN} \leq 1500$ mm.

Figure 3:
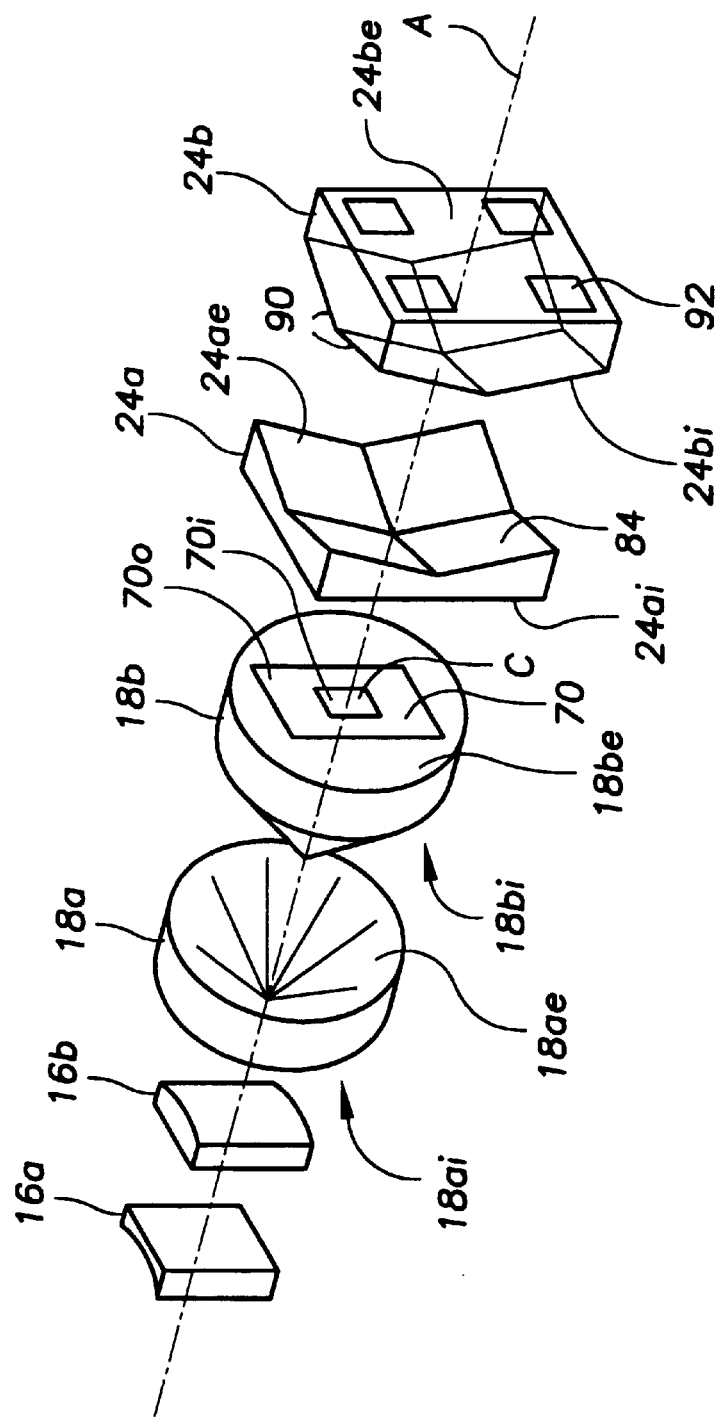
FIG. 3 is a schematic optical diagram, perspective view, of a section of exposure apparatus in FIG. 1 showing only a section of the illumination optical apparatus.

With reference now to FIGS. 1A, 1B and 3, the construction and action of conical prisms 18a and 18b and pyramidal prisms 24a and 24b constituting variable optical members 18 and 24, respectively, is explained. Conical prism 18 includes a most light-source-wise incident surface 18ai, which is planar and perpendicular to optical axis A. Conical prism 18a further includes an exit surface 18ae on the mask side (i.e., opposite incident surface 18i) which is formed in the shape of a conical concave surface (i.c., a frustrum) symmetric about optical axis A and whose concavity faces mask 48.

Conical prism 18b includes a most light-source-wise incident surface 18bi, which is formed in the shape of a conical convex surface symmetric about optical axis A and whose convexity faces light source 14. Conical prism 18b further includes an exit surface 18be, opposite incident surface 18bi, which is planar and perpendicular to optical axis A.

Surface 18ai of first conical prism 18a and surface 18bc of second conical prism 18b arc parallel to one another. Further, at least one of first conical prism 18a and second conical prism 18b is constructed so as to be moveable along optical axis A (i.e, axially moveable). Accordingly, there is a first state wherein surface 18ae conformably contacts surface 18bi. In this first state, conical prisms 18a and 18b function as a plane parallel plate, and the cross-sectional shape of light beam B is maintained upon passing through conical prisms 18a and 18b.

In contrast, in a second state, surface 18ae is spaced apart from surface 18bi. In this second state, light beam B entering conical prisms 18a and 18b is shifted equidistantly outwardly along the radial direction about optical axis A. As a result, the cross-section of incident light beam B, which is initially square, is shaped into a hollow square cross-section 70 upon passing through spaced apart conical prisms 18a and 18b (FIG. 3). Hollow square cross-section 70 includes an outer square 70o, an inner square 70i, and a common center C through which optical axis A passes.

With continuing reference to FIGS. 1A, 1B and 3, pyramidal prism 24a includes a most lightsource-wise incident surface 24ai, which is planar and perpendicular to optical axis A.

Pyramidal prism 24a further includes an exit surface 24ac opposite surface 24ai, which is formed in the shape of a regular square pyramidal surface (i.e., the side face of a regular square pyramid) symmetric about optical axis A and whose concavity faces mask 48.

Pyramidal prism 24b includes a most light-source-wise incident surface 24bi, which is formed in the shape of a regular square pyramidal convex surface symmetric about optical axis A and whose convexity faces light source 14. Pyramidal prism 24b further includes an exit surface 24be, opposite surface 24bi, which is planar and perpendicular to optical axis A.

Surface 24ae includes four facets 84 and surface 24bi includes four facets 90. Facets 84 and 90 are parallel to one another. Further, at least one of first pyramidal prism 24a and second pyramidal prism 24b is constructed so as to be moveable along optical axis A. Accordingly, in a first state, pyramidal prisms 24a and 24b conformably contact one another with contacting facets 84 and 90. In this first state, pyramidal prisms 24a and 24b function as a plane parallel plate, and the cross-sectional shape of light beam B is maintained upon passing through pyramidal prisms 24a and 24b.

On the other hand, in a second state, Pyramidal prism 24a is spaced apart from pyramidal prism 24b. In this second state, light beam B enters pyramidal prisms 24a and 24b and moves parallel from optical axis A toward the four corners along four radial axes (not shown) each inclined at 45 degrees with respect to the X-axis and Y-axis. As a result, in the second state, incident light beam B, having a square cross-section, passes through spaced apart pyramidal prisms 24a and 24b and is shaped into a light beam group comprising four light beams (not shown) each having a substantially square cross-section 92 (FIG. 3), with the center of each light beam substantially coincident with the four corners of a square about optical axis A.

By setting conical prisms 18a and 18b and pyramidal prisms 24a and 24b to their respective first states, a square light source is formed in the pupil plane P1 of condenser optical system 30, and so-called normal illumination can be obtained. In addition, by setting conical prisms 18a and 18b to the first state or second state and also setting pyramidal prisms 24a and 24b to the second state, a quadrupole light source (i.e., a light source comprising four light beams having a square cross-section or hollow square cross-section) is formed in pupil plane P1 of condenser optical system 30. Thus, so-called quadrupole modified illumination can be obtained. Furthermore, by setting conical prisms 18a and 18b to the second state and also setting pyramidal prisms 24a and 24b to the first state, an annular light source is formed in pupil plane P1 of condenser optical system 30. Thus, so-called annular modified illumination can be obtained.

As described above, conical prisms 18a and 18b and pyramidal prisms 24a and 24b constitute a light beam shaping apparatus for forming an annular light source in pupil plane P1 of condenser optical system 30, or a plurality of light sources (four, in this case) eccentric with respect to optical axis A. By arranging conical prisms 18a and 18b and pyramidal prisms 24a and 24b in exposure apparatus 10 of FIG. 1in the optical path between cylindrical expander 16 and plane P1 of condenser optical system 30, a modified light source is capable of being formed in pupil plane P1 . However, by arranging the same between integrator 36 and the pupil plane P2 of imaging optical system 40, a modified light source is capable of being formed in pupil plane P2.

As mentioned above, the number of light source images formed in surface 64 depends upon the number of internal reflections in integrator 36. Furthermore, the number of internal reflections depends upon the axial length of integrator 36 and the numerical aperture (NA) of incident light beam B. The NA and angle $\alpha$ are related by the relation NA=n×sinα, where n is the refractive index of the intervening medium, which can be taken as unity. The NA of incident light beam B changes depending on the focal length of condenser optical system 30. Thus, by suitably changing the focal length of condenser optical system 30, angle α (i.e., the NA) can be changed while maintaining convergence point F at a fixed position. Thus, by suitably changing the focal length of condenser optical system 30, the number of light source images formed can be adjusted while reliably avoiding concentrating too much light onto surface 36a, and thereby avoiding the risk of breaking integrator 36.

With reference now to FIG. 4, exposure apparatus 100 represents a second embodiment of the present invention and has a construction similar to that of exposure apparatus 10 of FIGS. 1A and 1B. However, whereas integrator 36 in exposure apparatus 10 has a substantially square cross-section, integrator 160 of exposure apparatus 100 has a substantially rectangular cross-section extending lengthwise along the Y-direction. In the description below, elements in exposure apparatus 100 having the same function as those in exposure apparatus 10 are assigned the same reference symbols. Exposure apparatus 100 is now explained below, with attention to the differences between exposure apparatus 10.

Figures 4A, 4B:
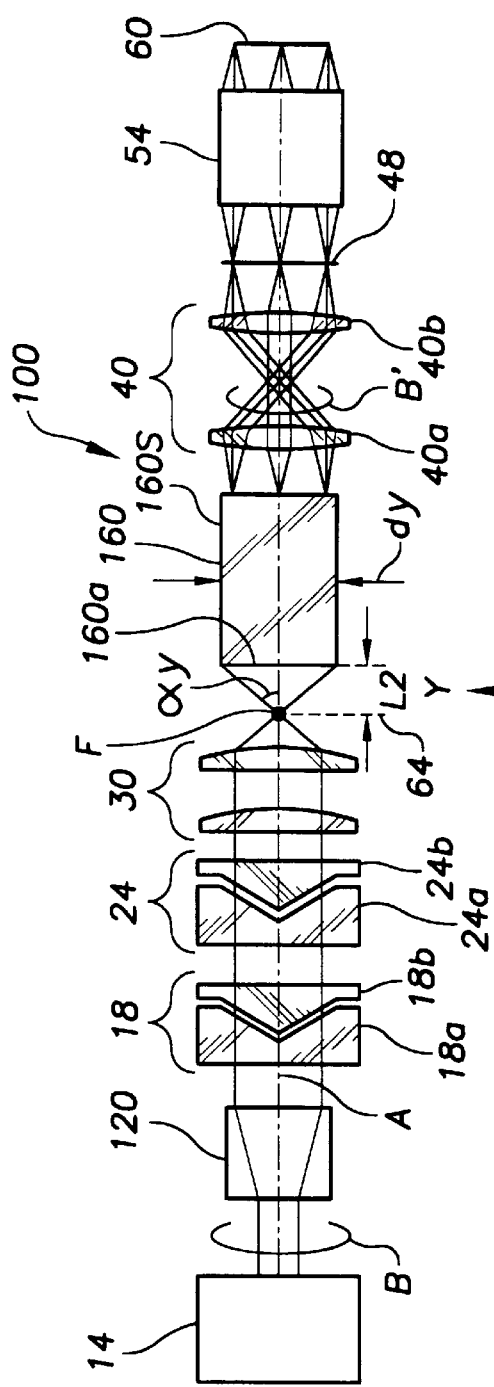
FIG. 4A is a schematic optical diagram in the Y-Z plane of a second embodiment of the exposure apparatus of the present invention provided with a second embodiment of the illumination optical apparatus of the present invention.
FIG. 4B is a schematic optical diagram in the X-Z plane of the exposure apparatus of FIG. 4A.

With continuing reference to FIG. 4 and exposure apparatus 100, light source 14 emits a substantially parallel light beam B having a rectangular cross-section extending lengthwise along the Y-direction. Rectangular light beam B enters a cylindrical expander 120 comprising, for example, a pair of cylindrical lenses 16a and 16b (not shown in FIGS. 4A and 4B), such as those in exposure apparatus 10 (FIGS. 1A and 1B). However, each cylindrical lens cylindrical expander 120 respectively has negative refractive power and positive refractive power in the Y-Z plane (FIG. 4A), and functions as a plane parallel plate in the X-Z plane (FIG. 4B). Accordingly, light beam B entering cylindrical expander 120 is expanded in the Y-direction, and is shaped to have a rectangular cross-section extending lengthwise along the Y-direction.

Light beam B passing through cylindrical expander 120 then passes through conical prisms 18a and 18b and pyramidal prisms 24a and 24b, and enters condenser optical system 30. Light beam B converges at convergence point F on optical axis A, and subsequently diverges at angle α and enters integrator 160. The latter includes an incident surface 160a, an exit surface 160b, outer surfaces 160S, and has a rectangular cross-section extending lengthwise along the Y-direction. As with exposure apparatus 100, light beam B enters integrator 160 and, through multiple internal reflections, forms a plurality of light beams B'. A plurality of light source images are formed in surface 64 passing through convergence point F and parallel to incident surface 160a. Light beams B', which appear to emanate from the plurality of light source images pass through imaging optical system 40 and uniformly illuminate mask 48. In exposure apparatus 100, a rectangular illumination field (not shown) similar to the cross-sectional shape of integrator 160 is formed on mask 48. Also, elements 14–40 and 120 and 160 constitute a second embodiment of the illumination optical apparatus of the present invention.

With continuing reference to FIGS. 4A and 4B, convergence point F and incident surface 160a of integrator 160 are spaced apart by a distance L2, similar to spacing L1 of exposure apparatus 10 (FIGS. 1A and 1B). Accordingly, unlike the prior art, a concentration of energy on incident surface 160a is avoided. As a result, solarization is satisfactorily controlled, and the formation of contaminants due to photochemical reactions is also reduced. This prevents integrator 160 from being damaged or breaking when used in conjunction with a high-output light source like an excimer laser.

For integrator 160 in exposure apparatus 100, it is preferable that adequate spacing L2 be ensured by satisfying the following conditions (2) and (3):

$$0.1 \text{ mm} \leq L2 \leq dx/(2 \times \tan \alpha x) \qquad (2)$$

$$0.1 \text{ mm} \leq L2 \, dy/(2 \times \tan \alpha y) \qquad (3)$$

wherein dx is the length (mm) of one side of integrator 160 along the X-direction, and dy is the length (mm) of the other side of integrator 160 along the Y-direction. In addition, αx is the divergence angle of light beam B as measured in the X-Z plane, and αy is the divergence incident angle in light beam B as measured in the Y-Z plane.

If spacing L2 falls below the lower limit in conditions (2) and (3), the spacing is too narrow, and the likelihood of integrator being damaged or breaking is greatly increased.

On the other hand, if spacing L2 exceeds the upper limit in conditions (2) and (3), the spacing widens excessively, and optical losses, i.e., (energy losses) occur at incident surface 160a.

To maintain a predetermined optical performance and to make exposure apparatus 100 compact, it is preferable to set the axial length $L_{IN} \leq 1500$ mm, i.e., the same as in exposure apparatus 10.

Also, in exposure apparatus 100, a modified light source can also be formed in pupil plane P2 of imaging optical system 40 by arranging conical prisms 18a and 18b and pyramidal prisms 24a and 24b in the optical path between integrator 160 and pupil plane P2.

As discussed above, the number of light source images formed in surface 64 depends upon the number of internal reflections in integrator 36 or 160. Furthermore, the number of internal reflections depends upon the length of the integrator and the NA (i.e., angle α) of the incident light beam, which can be changed by varying the focal length of condenser optical system 30. Accordingly, if the cross-section of the integrator (namely, the shape of incident surface) is not similar to the cross-section of light beam B incident integrator 36 of exposure apparatus 10 or integrater 160 of exposure apparatus 100, then the number of light source images formed along the X-direction of surface 64 will differ from the number of light source images formed along the Y-direction.

Generally, in an illumination optical apparatus employing a light pipe optical integrator, it is necessary to make the cross-section of the integrator and the cross-section of the light beam incident the integrator substantially similar. This makes the number of light source images formed in the orthogonal directions on the incident side of the integrator substantially the same, which makes the resolution of the projection optical system substantially the same in the orthogonal directions of the exposure field. Accordingly, even in the case wherein, for example, the light beam from a mercury lamp in an exposure apparatus is converged on the incident surface of the integrator and a light source image is formed on the incident surface, the resolution of the projection optical system can be made to substantially agree in the orthogonal directions of the exposure surface. This is accomplished by making the cross-section of the integrator and the shape of the light source image formed on the incident surface substantially similar in shape and size.

In the case of exposure apparatus 100, for example, if light beam B having a square cross-section is input into integrator 160 having a rectangular cross-section extending lengthwise along the Y-direction, the number of light source images formed along the X-direction becomes greater than the number of light source images formed along the Y-direction. As a result, the resolution of projection optical system 54 no longer coincides in the orthogonal directions (directions corresponding to the X-axis and Y-axis) of the exposure field. This creates the risk that the line width of the pattern formed on wafer 60 will not be the same along orthogonal directions of the exposure field. Accordingly, to make the number of light source images formed at surface 60 along the X-direction and the number of light source images formed along the Y-direction be substantially the same, it is preferable to provide a cylindrical expander 16 which allows for the cross-section of integrator 160 and the cross-section of incident beam B incident surface 160a to be substantially similar in shape and size.

In each of the exposure apparatus 10 and 100 described above, satisfactory projection and exposure can be performed under stable and satisfactory exposure conditions without the risk of damaging or breaking the integrator due to a high concentration of energy from a high-output light source, and without optical losses occurring at the integrator's incident surface. A wafer (e.g., wafer 60) that has undergone the exposure process (photolithography process) by exposure apparatus 10 (FIGS. 1A and 1B) or 100 (FIGS. 4A and 4B) afterward undergoes a photoresist development process, and then an etching process that removes undeveloped resist and etches the wafer so as to pattern the wafer, and then a resist removal process that removes the unneeded resist after the etching process. Afterwards, upon completion of wafer processing, further processes are performed in the actual assembly of the semiconductor device, such as dicing the wafer into its constituent printed circuits to create chips, bonding that assigns wiring and the like to each chip, and packaging that packages each chip.

The above explanation describes an example wherein semiconductor devices are manufactured by a photolithography process and a wafer process employing an exposure apparatus. However, liquid crystal display devices, thin-film magnetic heads, and image detectors (e.g., CCDs and the like) can also be manufactured as semiconductor devices by a photolithography process that uses the exposure apparatus of the present invention.

Thus, since exposure and patterning of a wafer can be performed under stable and satisfactory exposure conditions when manufacturing semiconductor devices and the like using the illumination optical apparatus of the present invention, satisfactory semiconductor devices and the like can be manufactured with high throughput.

Each exposure apparatus of the present invention may include an illumination optical apparatus provided with a high-output light source other than an excimer laser light source. For example, it is also possible to use, as light source 14 in the present invention, a light source unit comprising a laser light source like an $F_2$ laser that supplies light having a wavelength of 157 nm. Alternatively, a combination of a laser light source that provides light of a predetermined wavelength and a nonlinear optical element that converts the light from that laser light source to light of a short wavelength of <200 nm may also be used.

In addition, each exposure apparatus of the present invention, as discussed above, is provided with an illumination optical apparatus of the present invention. However, the illumination optical apparatus can also be applied to a general illumination optical apparatus for uniformly illuminating a surface to be irradiated other than a mask.

In the illumination optical apparatus of the present invention, as explained above, the energy acting upon the incident surface of the integrator is significantly reduced compared with the prior art. The illumination optical apparatus of the present invention provides light to the integrator while avoiding an energy concentration occurring on the incident surface of the integrator sufficient to damage or break the integrator. Accordingly, solarization is satisfactorily controlled and the formation of contaminants due to photochemical reactions is also reduced, without the risk of the integrator breaking due to the use of a high-output light source. This differs significantly from the prior art, wherein the convergence point is formed on the incident surface of the integrator, creating an energy concentration sufficient to damage or break the integrator.

Accordingly, in an exposure apparatus of the present invention that incorporates the illumination optical apparatus according to the present invention, since there is no damage or breakage of the integrator even if a high-output light source is used, satisfactory projection and exposure can be performed with high throughput under stable and satisfactory exposure conditions. In addition, the semiconductor device manufacturing method of the present invention includes a process that uses the illumination optical apparatus and exposure apparatus according to the present invention to pattern a photosensitive substrate. In this manner, satisfactory semiconductor devices and the like can be manufactured, since projection and exposure can be performed under stable and satisfactory exposure conditions.

While the present invention has been described in connection with preferred embodiments and Working Examples, it will be understood that it is not so limited. On the contrary, it is intended to cover all alternatives, modifications and equivalents as may be included within the spirit and scope of the invention as defined in the appended claims.

What is claimed is:

1. An exposure apparatus for patterning a photosensitive substrate with a pattern formed on a mask, comprising:

an illumination optical system for illuminating the mask; and a projection optical system arranged in an optical path between the mask and the photosensitive substrate, so as to project an image of the pattern formed on the mask onto the photosensitive substrate;

wherein said illumination optical system comprises:

a light source for providing a light beam having a cross-sectional shape;

a light guide optical system disposed in the optical path between said light source and the mask, so as to guide the light beam to a convergence point;

an internal reflection-type integrator disposed in the optical path between said light guide optical system and the mask so as to form a plurality of secondary light sources, said internal reflection-type integrator having a rectangular cross-sectional shape with a first side of length dx alone a first direction perpendicular to an optical axis and a second side dy along a second direction perpendicular to the first direction and perpendicular to the optical axis, and an incident surface spaced from the convergence point along the optical axis by spacing L; and an imaging optical system disposed in the optical path between said internal reflection-type integrator and the mask so as to direct the light beam to the mask; wherein the following conditions are satisfied:

$$0.1 \leq L \leq dx/(2 \times \tan \alpha x)$$

$$0.1 \leq L \leq dy/(2 \times \tan \alpha y),$$

wherein αx is an angle of said light beam incident to said incident surface, as measured in a first plane parallel to the first direction that includes the optical axis, and αy is an angle of the light beam incident to said incident surface, as measured in a second plane orthogonal to said first plane that includes the optical axis.

2. An exposure apparatus according to claim 1, wherein said light guide optical system includes an adjusting system capable of adjusting the cross-sectional shape of the light beam so as to form the cross-sectional shape of the light beam substantially similar to the cross-sectional shape of said internal reflection-type integrator.

3. An exposure apparatus according to claim 1, wherein said light guide optical system includes a varifocal optical system to change a numerical aperture of the light beam diverging from the convergence point while maintaining the convergence point outside said incident surface of said internal reflection-type integrator.

4. An exposure apparatus according to claim 3, wherein said varifocal optical system includes a condenser optical system that has a variable focal length.

5. An exposure apparatus according to claim 1, wherein said internal reflection-type integrator has an axial length $L_{IN} \leq 1500$ mm.

6. An exposure apparatus according to claim 2, wherein said light guide optical system includes a light beam shape changing system to chance the light beam into either an annular light beam having an annular cross-sectional shape or into a multipole light beam having a multi-pole cross-sectional shape.

7. An exposure apparatus according to claim 6, wherein said light beam shape changing system includes a first member having a conical surface and a second member having a conical surface; and
wherein at least one of said first member and second member is movable so as to form an annular light intensity distribution at a pupil plane of said illumination optical system.

8. An exposure apparatus according to claim 6, wherein said light beam shape changing system includes a first member having a pyramidal surface and a second member having a pyramidal surface; and
wherein at least one of said first member and said second member is movable so as to form a quadrupole light intensity distribution at a pupil plane of said illumination optical system.

9. An exposure apparatus according to claim 1, wherein said spacing L is a fixed distance.

10. An exposure apparatus according to claim 6, wherein said light beam shape changing system includes a first optical system disposed to change the light beam into an annular light beam having an annular cross-sectional shape and a second optical system disposed to change the light beam into a multipole light beam having a multi-pole cross-sectional shape.

11. An exposure apparatus according to claim 10, wherein said first optical system includes at least one conical surface and said second optical system includes at least one pyramidal surface.

12. An exposure apparatus for patterning a photosensitive substrate with a pattern formed on a mask, comprising:
an illumination optical system for illuminating the mask; and
a projection optical system arranged in an optical path between the mask and the photosensitive substrate, so as to project an image of the pattern formed on the mask onto the photosensitive substrate;
wherein the illumination optical system comprises:
a light source for providing a light beam having a first cross-sectional shape;
an internal reflection-type integrator disposed in the optical path between said light source and the mask so as to form a plurality of secondary light sources;
an imaging optical system disposed in the optical path between said internal reflection-type integrator and the mask so as to direct the light beam to the mask; and
a light guide optical system disposed in the optical path between said light source and said internal reflection-type integrator so as to guide the light beam to a convergence point spaced from an incident surface of said internal reflection-type integrator, said light guide optical system including a beam shaping system disposed to shape the first cross-sectional shape so that a second cross-sectional shape of the light beam directed to said internal reflection-type integrator is similar to an incident surface shape of said internal reflection-type integrator.

13. An exposure apparatus according to claim 12, wherein said incident surface of said internal reflection-type integrator is spaced from the convergence point along an optical axis by a spacing L.

14. An exposure apparatus according to claim 13, wherein said spacing L satisfies the conditions:

$$0.1 \leq L \leq dx/(2 \times \tan \alpha x)$$

$$0.1 \leq L \leq dy/(2 \times \tan \alpha y),$$

wherein said internal reflection-type integrator has a rectangular cross-sectional shape, and dx is a length of a first side of said internal reflection-type integrator along a first direction perpendicular to the optical axis, dy is a length of a second side of said internal reflection-type integrator along a second direction perpendicular to the first direction and perpendicular to the optical axis, αx is an angle of the light beam incident to said incident surface, as measured in a first plane parallel to the first direction that includes the optical axis, and αy is an angle of the light beam incident to said incident surface, as measured in a second plane orthogonal to the first plane that includes the optical axis.

15. An exposure apparatus according to claim 13, wherein said spacing L is a fixed distance.

16. A method of patterning a photosensitive substrate with a pattern formed on a mask, comprising the steps of:
providing a light beam having a cross-sectional shape;
adjusting the light beam;
guiding the adjusted light beam to a convergence point spaced from an incident surface of an internal reflection-type integrator;
directing the light beam passed through said internal reflection-type integrator to the mask; and
projecting an image of the pattern formed on the mask onto the photosensitive substrate.

17. A method according to claim 17, wherein said adjusting step includes the step of adjusting the cross-sectional shape of the light beam so as to form the cross-sectional shape of the light beam substantially similar to a cross-sectional shape of said internal reflection-type integrator.

18. A method according to claim 16, wherein said adjusting step includes the step of changing the light beam into either an annular light beam having an annular cross-sectional shape or into a multipole light beam having a multi-pole cross-sectional shape.

19. An exposure apparatus for exposing a pattern formed on a mask onto a photosensitive substrate, comprising:
an illumination optical system for illuminating the mask; and
a projection optical system arranged in an optical path between the mask and the photosensitive substrate, so as to project an image of the pattern formed on the mask onto the photosensitive substrate;
wherein said illumination optical system comprises:
a light source for providing a light beam;
a light guide optical system disposed in the optical path between said light source and the mask, so as to guide the light beam to a convergence point; and
an internal reflection-type integrator disposed in the optical path between said light guide optical system and the mask, said internal reflection-type integrator including an incident surface spaced from the convergence point;
wherein said light guide optical system includes a varifocal optical system to change a numerical aperture of the light beam diverging from the convergence point while maintaining the convergence point outside said incident surface of said internal reflection-type integrator.

20. An exposure apparatus according to claim 19, wherein said varifocal optical system changes the numerical aperture of the light beam diverging from the convergence point without moving the convergence point.

21. An exposure apparatus according to claim 19, wherein said light guide optical system further comprises an adjusting system that adjusts a cross-sectional shape of the light beam so as to form the cross-sectional shape of the light beam substantially similar to a cross-sectional shape of said internal reflection-type integrator.

22. An exposure apparatus according to claim 19, wherein said light guide optical system further comprises a light beam shape changing system to change the light beam into either an annular light beam having an annular cross-sectional shape or into a multipole light beam having a multi-pole cross-sectional shape.

23. An exposure apparatus according to claim 19, wherein said light guide optical system further comprises a light beam shape changing system that includes a first optical system disposed to change the light beam into an annular light beam having an annular cross-sectional shape and a second optical system disposed to change the light beam into a multipole light beam having a multi-pole cross-sectional shape.

24. An exposure apparatus according to claim 23, wherein said first optical system includes at least one conical surface and said second optical system includes at least one pyramidal surface.

25. A method of manufacturing a semiconductor device, comprising the steps of:
providing a light beam;
guiding the light beam to a convergence point;
directing the light beam diverging from the convergence point to an internal reflection-type integrator;
changing a numerical aperture of the light beam diverging from the convergence point while maintaining the convergence point outside an incident surface of said internal reflection-type integrator;
directing the light beam passed through said internal reflection-type integrator to the mask; and
projecting an image of the pattern formed on the mask onto the photosensitive substrate.

26. A method according to claim 25, wherein said changing step changes the numerical aperture of the light beam diverging from the convergence point without moving the convergence point.

27. A method according to claim 25, further comprising the step of adjusting a cross-sectional shape of the light beam so as to form the cross-sectional shape of the light beam substantially similar to a cross-sectional shape of said internal reflection-type integrator.

28. A method according to claim 25, further comprising the step of changing the light beam into either an annular light beam having an annular cross-sectional shape or into a multipole light beam having a multi-pole cross-sectional shape.

29. An exposure apparatus for patterning a photosensitive substrate with a pattern formed on a mask, comprising:
an illumination optical system for illuminating the mask; and
a projection optical system arranged in an optical path between the mask and the photosensitive substrate, so as to project an image of the pattern formed on the mask onto the photosensitive substrate;
wherein said illumination optical system comprises:
a light source for providing a light beam having a first cross-sectional shape;
an integrator disposed in the optical path between said light source and the mask so as to form a plurality of secondary light sources;
an imaging optical system disposed in the optical path between said integrator and the mask so as to direct the light beam to the mask; and
a light guide optical system disposed in the optical path between said light source and said integrator so as to guide the light beam to said integrator, said light guide optical system comprising a light beam shape changing system that includes a first optical system disposed to change the light beam into an annular light beam having an annular cross-sectional shape and a second optical system disposed to change the light beam into a multipole light beam having a multi-pole cross-sectional shape.

30. An exposure apparatus according to claim 29, wherein said first optical system includes at least one conical surface and said second optical system includes at least one pyramidal surface.

31. A method of manufacturing a semiconductor device, comprising the steps of:
providing a light beam having a cross-sectional shape;
adjusting the light beam;
guiding the adjusted light beam to an integrator;
directing the light beam passed through said integrator to a mask; and
projecting an image of a pattern formed on the mask onto a photosensitive substrate,
wherein said adjusting step comprises the steps of:
selecting whether the light beam is converted into an annular light beam having an annular cross-sectional shape or a multipole light beam having a multi-pole cross-sectional shape, and changing the light beam into either the annular light beam having the annular cross-sectional shape or into the multipole light beam having the multi-pole cross-sectional shape after said selecting step.

32. A method according to claim 31, wherein said changing step comprises the steps of using a first optical system when the light beam is converted into the annular light beam having the annular cross-sectional shape, and using a second optical system when the light beam is converted into the multipole light beam having the multi-pole cross-sectional shape.

33. A method according to claim 32, wherein said first optical system includes at least one conical surface and said second optical system includes at least one pyramidal surface.

* * * * *